United States Patent
Jo et al.

(10) Patent No.: US 8,315,122 B2
(45) Date of Patent: Nov. 20, 2012

(54) MULTI-CHIP PACKAGE SEMICONDUCTOR MEMORY DEVICE PROVIDING ACTIVE TERMINATION CONTROL

(75) Inventors: Keun-soo Jo, Hwaseong-si (KR); Dong-yang Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 324 days.

(21) Appl. No.: 12/717,246

(22) Filed: Mar. 4, 2010

(65) Prior Publication Data
US 2010/0232196 A1   Sep. 16, 2010

(30) Foreign Application Priority Data

Mar. 12, 2009   (KR) .................. 10-2009-0021240

(51) Int. Cl.
*G11C 8/00*   (2006.01)
(52) U.S. Cl. .................. 365/230.03; 365/191; 365/198; 326/30

(58) Field of Classification Search .................. 365/191, 365/198, 230.03; 326/30
See application file for complete search history.

(56) References Cited

U.S. PATENT DOCUMENTS

| | | | |
|---|---|---|---|
| 6,717,832 B2 | 4/2004 | Johnson et al. | |
| 2006/0262586 A1* | 11/2006 | Solomon et al. | 365/63 |
| 2009/0273960 A1* | 11/2009 | Kim et al. | 365/51 |

FOREIGN PATENT DOCUMENTS

| | | |
|---|---|---|
| KR | 1020030008327 A | 1/2003 |
| KR | 1020050083955 A | 8/2005 |

* cited by examiner

*Primary Examiner* — Hoai V Ho
(74) *Attorney, Agent, or Firm* — Volentine & Whitt, PLLC

(57) ABSTRACT

A semiconductor memory device having a multi-chip package structure providing active termination control. The semiconductor memory device includes first and second memory chips sharing a data I/O bus. The first memory chip includes a first chip enable (CE) port determining whether the first memory chip is activated, and a second CE port monitoring whether the second memory chip is activated. An active termination unit is turned ON only when the first and second chips are deactivated.

15 Claims, 2 Drawing Sheets

MULTI-CHIP PACKAGE SEMICONDUCTOR MEMORY DEVICE PROVIDING ACTIVE TERMINATION CONTROL

CROSS-REFERENCE TO RELATED APPLICATIONS

This application claims the benefit of Korean Patent Application No. 10-2009-0021240 filed on Mar. 12, 2009, the subject matter of which is hereby incorporated by reference.

BACKGROUND

The inventive concept relates to semiconductor memory devices. More particularly, the inventive concept relates to semiconductor memory devices implemented with a multi-chip package (MCP) structure. Such MCP semiconductor memory devices provide active termination to a common data I/O bus.

Many electronic systems include a controller and memory device(s) configured to exchange data via one or more data bus(es). The use of data buses in such systems is well known as are the problems associated with properly terminating the controller and memory devices to a bus. Improperly terminated signal lines within a bus will generate noise in the form of signal reflections. There are many different ways to terminate a data bus signal line, by a resistor connected between the signal line and a power supply node is common.

For incorporating systems, such as computers, signal line terminations may be provided using (relatively large) external resistors disposed on a printed circuit board (i.e., a computer system motherboard). Thus, a signal line interconnecting integrated circuits (ICs) may be effectively terminated by selecting an external resistor having a desired impedance. When the impedance of the selected external resistor matches the signal line impedance, signal reflections rarely occur in a meaningful way. However, external resistors disposed on a system board for each one of a great multiplicity of signal lines occupy a large amount physical space.

As an alternative to the use of external resistors, so-called "on-chip termination" or "on-die termination" (ODT) may be used. Such signal line termination circuits are commonly referred to as "active termination units", and may be used for many of the ICs forming contemporary consumer electronics. Active termination is a method in which a termination resistor is inserted into, for example, each of a memory device and a controller chip and is then turned ON/OFF as needed.

Methods of turning ON/OFF an active termination unit may vary according to the configuration of the memory device and related input commands. For example, one method of turning ON/OFF an active termination unit provides that a memory controller apply various configuration setting signals to a mode register within a connected memory device. Another method of turning ON/OFF an active termination unit identifies whether a current memory system command is directed to a particular memory device.

If a semiconductor memory device has a multi-chip package (MCP) structure in which two or more memory chips share a common data I/O bus, then each of the memory chips may turn ON a related active termination unit when a corresponding chip enable (CE) signal is provided to the memory chip. This approach to memory system control is referred to as 'self-termination'. Also, each of the memory chips may turn ON a related active termination unit when a CE signal is generated within the memory chip itself. This operation is referred to as 'other termination' and is essentially the opposite of the self-termination approach.

However, when "other termination" is performed by a memory device having an MCP structure, for example, when a first memory chip and a second memory chip are disposed in the memory device and the second memory chip is activated in response to a corresponding CE signal internally generated within the second memory chip, then the first memory chip turns ON a termination resistor included in the first memory chip since a corresponding CE signal generated within the first memory chip itself is not activated. In this case, when the termination resistor included in the first memory chip is turned ON, a data input/output (I/O) line is terminated (i.e., self-termination occurs in the accessed second memory chip since a data IO line is shared between the first and second memory chips).

Accordingly, a controller chip set should individually and independently supply a control signal to the memory chips included within a MCP semiconductor memory device in order to differentiate said control signals. Unfortunately, this result increases the number of terminals for individually supplying control signals from the controller in a chip set.

SUMMARY

The inventive concept provides a semiconductor memory device having a multi-chip package (MCP) structure and related control method that are capable of providing active memory chip termination in a manner that does not necessarily increase control terminal count.

According to an aspect of the inventive concept, there is provided a multi-chip package (MCP) semiconductor memory device receiving first and second chip enable (CE) signals and comprising; a first memory chip comprising a first CE port configured to receive the first CE signal, wherein the first memory chip is activated/deactivated in response to the first CE signal and configured to provide data to a data input/output (I/O) bus via an active termination unit, and a second memory chip comprising a CE port configured to receive the second CE signal, wherein the second memory chip is activated/deactivated in response to the second CE signal and configured to provide data to the data input/output (I/O) bus, wherein the active termination unit is turned ON only when both of the first and second memory chips are deactivated.

According to another aspect of the inventive concept, there is provided a memory system comprising a controller configured to provide first and second chip enable (CE) signals to a first multi-chip package (MCP) semiconductor memory device, wherein the first MCP semiconductor memory device comprises; a first memory chip comprising a first CE port configured to receive the first CE signal, wherein the first memory chip is activated/deactivated in response to the first CE signal and configured to provide data to a data input/output (I/O) bus via an active termination unit; and a second memory chip comprising a CE port configured to receive the second CE signal, wherein the second memory chip is activated/deactivated in response to the second CE signal and configured to provide data to the data input/output (I/O) bus, wherein the active termination unit is turned ON only when both of the first and second memory chips are deactivated.

According to another aspect of the inventive concept, there is provided a method of operating multi-chip package (MCP) semiconductor memory device including first and second memory chips sharing a common data input/output (I/O) bus, the method comprising; determining whether the first memory chip is activated, determining whether the second memory chip is activated, and turning ON an active termination unit connecting the first memory chip to the data I/O bus only when both of the first and second memory chips are deactivated.

BRIEF DESCRIPTION OF THE DRAWING

Embodiments of the inventive concept will be described with reference to the accompanying drawings in which.

DETAILED DESCRIPTION OF THE EMBODIMENTS

Certain embodiments of the inventive concept will now be described in some additional detail with reference to the accompanying drawing. It should be noted that the inventive concept may be variously embodied and should not be construed as being limited to only the illustrated embodiments. Throughout the written description and drawings, like reference numbers and labels denote like or similar elements.

Figure 1:
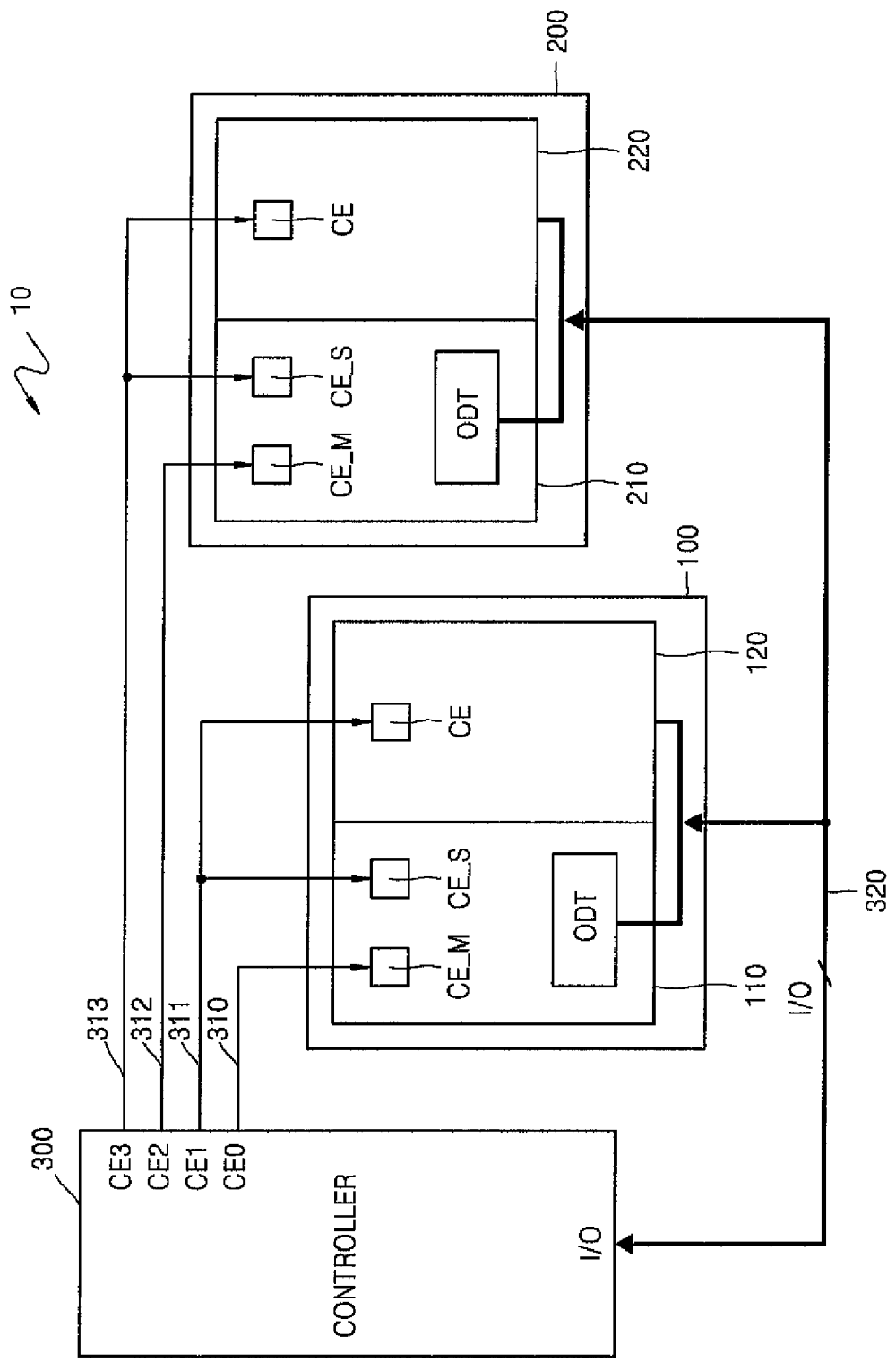
FIG. 1 is a block diagram of a memory system including a plurality of semiconductor memory devices connected to a controller according to an embodiment of the inventive concept.

FIG. 1 a block diagram of a memory system 10 including a controller 300 connected to a plurality (e.g., first and second) of semiconductor memory devices 100 and 200 according to one possible embodiment of the inventive concept. Referring to FIG. 1, the first semiconductor memory device 100 is implemented in a multi-chip package (MCP) including a first memory chip 110 and a second memory chip 120. Similarly, the second semiconductor memory device 200 is implemented in a MCP comprising a third memory chip 210 and a fourth memory chip 220. The controller 300 may be connected to the first and second semiconductor memory devices 100 and 200 via one of many different bus (or signal line) structures of conventional design. In the illustrated embodiment of FIG. 1, it is assumed that memory system bus structure(s) include a plurality of chip enable (CE) signal lines 310 through 313, as well as a data input/output (I/O) bus 320. It will be apparent to those of skilled in the art that the system 10 may include various other conventionally understood elements (e.g., signal lines, buses, drivers, etc.), but such are omitted from this description for the sake of clarity.

The first memory chip 110 within the first semiconductor memory device 100 is "activated" (i.e., data may be read from, written to, or erase from the memory device) in response to a first CE signal CE0 transmitted via a first CE signal line 310. The first memory chip 110 includes first and second CE ports CE_M and CE_S as well as an active on-die termination (ODT) unit associated with the I/O bus structure 320. In the first memory chip 110, the first CE port CE_M receives the first CE signal CE0 provided with respect to the first memory chip 110, but the second CE port CE_S receives the second CE signal CE1 provided with respect to another memory chip within the multi-chip packaged (MCP) semiconductor memory device 100 (i.e., the second memory chip 120 in the illustrated embodiment). Thus, the first memory chip 110 is able to determine via the first and second CE ports CE_M and CE_S whether the first memory chip 110 of the first MCP semiconductor memory device 100 is activated (or being accessed) or whether the other memory chip in the first MCP semiconductor memory device 100 (i.e., the second memory chip 120 in the illustrated embodiment) is activated.

The second memory chip 120 is activated in response to a second CE signal CE1 transmitted via a second CE signal lines 311, but includes only a single CE port receiving the second CE signal CE1 provided with respect to the second memory chip 120.

The active termination unit ODT in the first memory chip 110 is coupled to the first and second CE ports CE_M and CE_S. The active termination unit ODT in the first memory chip 110 is turned OFF when at least one of the first and second CE ports CE_M and CE_S is active. A CE port is active or enabled when an applied chip enable signal (e.g., CE0 and CE1) is activated. That is, the active termination unit ODT is turned OFF when it is determined that at least one of the first and second memory chips 110 and 120 is currently activated (i.e., being accessed by the controller 300, for example).

Only when it is determined that both the first and second memory chips 110 and 120 of the first MCP semiconductor memory device 100 are deactivated (i.e., not being accessed) and both the first and second CE enable signals are disabled will the active termination unit ODT in the first memory chip 110 is turned ON.

Thus, as shown in the following Table 1, in the first MCP semiconductor memory device 100, an active termination unit ODT in the first memory chip 110 is turned OFF when at least one of the first and second memory chips 110 and 120 is accessed and is turned ON when both of the first and second memory chips 110 and 120 are not being accessed.

TABLE 1

| ODT Termination State | Chip Enable Signal States | |
|---|---|---|
| | CE0 | CE1 |
| OFF | OFF | ON |
| OFF | ON | OFF |
| ON | OFF | OFF |

Similar to the first MCP semiconductor memory device 100, the second MCP semiconductor memory device 200 includes the third memory chip 210 which is accessed in response to a third CE signal CE2 transmitted via a third CE signal line 312, and the fourth memory chip 220 which is accessed in response to a fourth CE signal CE3 transmitted via a fourth CE signal line 313. The third memory chip 210 similarly includes first and second CE ports CE_M and CE_S and an active termination unit ODT. The fourth memory chip 220 includes only the one CE port CE. In the third memory chip 210, the first CE port CE_M receives the third CE signal CE2 provided with respect to the third memory chip 210 and the second CE port CE_S receives the fourth CE signal CE3 provided with respect to the fourth memory chip 220. In the fourth memory chip 220, the CE port CE receives the fourth CE signal CE3 generated in the fourth memory chip 220.

In the second MCP semiconductor memory device 200, the active termination unit ODT in the third memory chip 210 is turned OFF when at least one of the third and fourth memory chips 210 and 220, which commonly share the data I/O bus 320, is accessed and is turned ON only when both of the third and fourth memory chips 210 and 220 are not being accessed.

In the system 10, when the first memory chip 110 is being accessed, the active termination unit ODT in the first memory chip 110 of the first MCP semiconductor memory device 100 is turned OFF and the active termination unit ODT in the third memory chip 210 of the second MCP semiconductor memory device 200 is turned ON. In contrast, when the third memory chip 210 is being accessed, the active termination unit ODT in the first memory chip 110 of the first MCP semiconductor memory device 100 is turned ON and the active termination unit ODT in the third memory chip 210 of the second MCP semiconductor memory device 200 is turned OFF.

The foregoing embodiment of the inventive concept makes it possible to independently provide other types of signal line termination for the first and second MCP semiconductor memory devices 100 and 200 without necessarily providing additional terminals dedicated to ODT control by the controller 300.

Figure 2:
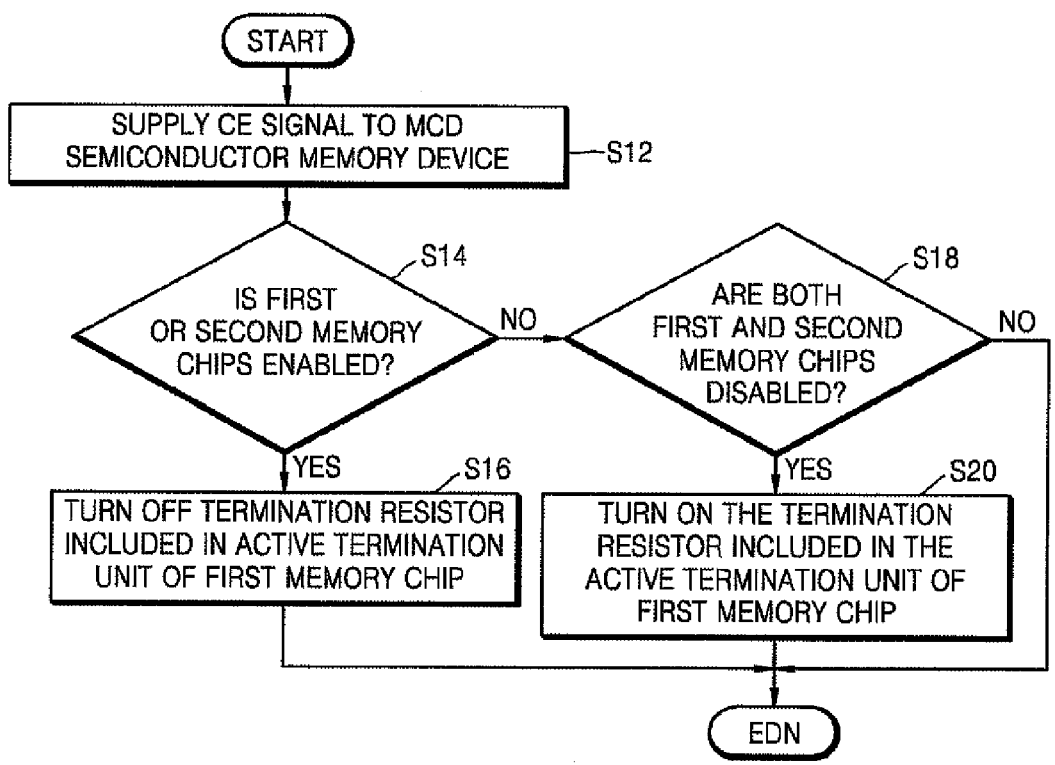
FIG. 2 is a flowchart summarizing a method of operating the semiconductor memory device of FIG. 1 according to an embodiment of the inventive concept.

FIG. 2 is a flowchart summarizing a method of controlling the operation of the semiconductor memory device of FIG. 1 according to an embodiment of the inventive concept. Referring to FIGS. 1 and 2, a CE signal is supplied to at least one of the MCP semiconductor memory devices within the memory system 10 (S12), wherein each MCP semiconductor memory device is assumed to include first and second memory chips. Then, for each MCP semiconductor memory device (e.g., 100 and 200) within the memory system 10 it is determined whether the applied CE signal is associated with either the first CE port CE_M of the first memory chip (110 or 210) or the CE port CE of the second memory chip (120 or 220) (S14). If either one the first CE port CE_M for the first memory chip (110 or 210) or the second CE port CE for the second memory chip (120 or 220) is activated (S14=YES), the active termination unit ODT in the first memory chip (110 or 210) is turned OFF (S16).

It should be noted that the activated/deactivated state of either the first memory chip (110 or 210) or the second memory chip (120 or 220) may be first determined (e.g.) in relation to the state of a corresponding CE port. Once this first determination has been made in the negative (S14=NO), it is necessary to determine the activated/deactivated state for the other one of the first memory chip (110 or 210) or the second memory chip (120 or 220). In essence, a determination is made as to whether both of the first memory chip (110 or 210) and the second memory chip (120 or 220) are deactivated (e.g., in response to the enable/disable state of the corresponding CE signals (S18). Only when both of the first and second memory chips (110 or 210, 120 or 220) in a particular MCP semiconductor memory device (100 or 200) are disabled (S18=YES), is the active termination unit ODT in the corresponding first memory chip (110 or 210) turned ON (S20).

In certain embodiments of the inventive concept, it should be noted, one or more of the constituent memory chips may be able to operate in both a "self-termination" mode responsive to a corresponding CE signal and an "other-termination" mode in which activation may be internally generated within the memory chip. In this regard, the determination steps (S14 and S28) summarized above in relation to FIG. 2 may incorporate the possibility of "other-termination" by one or more of the constituent memory chips.

It should also be noted that the foregoing embodiments assume only two (2) memory chips provided within each MCP semiconductor memory device 100 and 200. Those skilled in the art will recognize that additional (e.g., $2^{nd}$ through $N-1^{th}$) memory chips may be provided between a first ($1^{st}$) memory chip and a last ($N^{th}$) memory chip. Furthermore, the active termination unit ODT for a particular MCP semiconductor device may be provided in any one of the "N" constituent memory chips.

While the inventive concept has been particularly shown and described with reference to exemplary embodiments thereof, it will be understood that various changes in form and details may be made therein without departing from the scope of the following claims.

What is claimed is:

1. A multi-chip package (MCP) semiconductor memory device receiving first and second chip enable (CE) signals and comprising:
   a first memory chip comprising a first CE port configured to receive the first CE signal, a second CE port configured to receive the second CE signal, and an active termination unit associated with a data input/output (I/O) bus, wherein the first memory chip is activated/deactivated in response to the first CE signal and configured to provide data to the data input/output (I/O) bus via the active termination unit; and
   a second memory chip comprising a CE port configured to receive the second CE signal, wherein the second memory chip is activated/deactivated in response to the second CE signal and configured to provide data to the data input/output (I/O) bus,
   wherein the active termination unit in the first memory chip is turned ON only when both of the first and second memory chips are deactivated, as indicated by the first and second CE signals received at the first and second CE ports of the first memory chip, respectively.

2. The semiconductor memory device of claim 1, wherein the activated/deactivated state of the first memory chip is determined by a state of the first CE signal received at the first CE port.

3. The semiconductor memory device of claim 1, wherein the activated/deactivated state of the second memory chip is determined by a state of the second CE signal received at the CE port.

4. The semiconductor memory device of claim 1, wherein the second CE signal is provided to the second CE port of the first memory chip and the CE port of the second memory chip via a common CE signal line.

5. A memory system comprising:
   a controller configured to provide first and second chip enable (CE) signals to a first multi-chip package (MCP) semiconductor memory device, wherein the first MCP semiconductor memory device comprises:
      a first memory chip comprising a first CE port configured to receive the first CE signal, a second CE port configured to receive the second CE signal and an active termination unit, wherein the first memory chip is activated/deactivated in response to the first CE signal and configured to provide data to a data input/output (I/O) bus via the active termination unit; and
      a second memory chip comprising a CE port configured to receive the second CE signal, wherein the second memory chip is activated/deactivated in response to the second CE signal and configured to provide data to the data input/output (I/O) bus,
      wherein the active termination unit is turned ON only when both of the first and second memory chips are deactivated, as indicated by the first and second CE signals received at the first and second CE ports of the first memory chip, respectively.

6. The memory system of claim 5, wherein the activated/deactivated state of the first memory chip is determined by a state of the first CE signal received at the first CE port.

7. The memory system of claim 5, wherein the activated/deactivated state of the second memory chip is determined by a state of the second CE signal received at the CE port.

8. The memory system of claim 5, wherein the second CE signal is provided to the second CE port of the first memory chip and the CE port of the second memory chip via a common CE signal line.

9. The memory system of claim 5, wherein the controller is further configured to provide third and fourth CE signals to a second multi-chip package (MCP) semiconductor memory device, wherein the second MCP semiconductor memory device comprises:
   a third memory chip comprising a first CE port configured to receive the third CE signal, a second CE port configured to receive the fourth CE signal and an active termination unit, wherein the third memory chip is activated/deactivated in response to the third CE signal and configured to provide data to the data input/output (I/O) bus via the active termination unit; and
   a fourth memory chip comprising a CE port configured to receive the fourth CE signal, wherein the fourth memory chip is activated/deactivated in response to the fourth CE signal and configured to provide data to the data input/output (I/O) bus,
   wherein the active termination unit is turned ON only when both of the third and fourth memory chips are deactivated.

10. A method of operating multi-chip package (MCP) semiconductor memory device including first and second memory chips sharing a common data input/output (I/O) bus, the method comprising:
   receiving first and second chip enable (CE) signals at the first memory chip;
   determining whether the first memory chip is activated based on the first CE signal;
   determining whether the second memory chip is activated based on the second CE signal; and
   turning ON an active termination unit of the first memory chip, connecting the first memory chip to the data I/O bus, only when both of the first and second memory chips are deactivated.

11. The method of claim 10, wherein the second CE signal is provided to the first and second memory chips via a common CE signal line.

12. The method of claim 10, wherein the first and second CE signals are provided from a controller configured to control the operation of the first and second memory chips.

13. The method of claim 10, wherein the MCP semiconductor memory device comprise N memory chips sharing the data I/O bus, wherein the first memory chip within the N memory chips is one of the first through $N-1^{th}$ memory chips and the second memory chip is the $N^{th}$ memory chip.

14. The semiconductor memory device of claim 1, wherein the active termination unit of the first memory chip is the only active termination unit used by the semiconductor memory device for terminating the data input/output (I/O) bus.

15. The semiconductor memory device of claim 9, wherein the active termination unit of the first memory chip is the only active termination unit used by the first MCP semiconductor memory device for terminating the data input/output (I/O) bus, and the active termination unit of the third memory chip is the only active termination unit used by the second MCP semiconductor memory device for terminating the data input/output (I/O) bus.

* * * * *